(12) United States Patent
Inoue

(10) Patent No.: US 8,116,066 B2
(45) Date of Patent: Feb. 14, 2012

(54) METHOD OF MANUFACTURING ELECTRONIC COMPONENT BUILT-IN SUBSTRATE

(75) Inventor: Osamu Inoue, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 191 days.

(21) Appl. No.: 12/366,140

(22) Filed: Feb. 5, 2009

(65) Prior Publication Data
US 2009/0215231 A1  Aug. 27, 2009

(30) Foreign Application Priority Data
Feb. 25, 2008  (JP) .................. 2008-042621

(51) Int. Cl.
*H01G 4/06* (2006.01)
(52) U.S. Cl. .................................. 361/321.4
(58) Field of Classification Search ........... 361/321.4, 361/321.6
See application file for complete search history.

(56) References Cited

U.S. PATENT DOCUMENTS

| 2005/0130349 A1* | 6/2005 | Sunohara ............ 438/108 |
| 2006/0118931 A1* | 6/2006 | Ho et al. ............ 257/678 |
| 2007/0087512 A1 | 4/2007 | Cho |

FOREIGN PATENT DOCUMENTS

| JP | 2005-302854 A1 | 10/2005 |
| JP | 2007-116155 A1 | 5/2007 |

* cited by examiner

*Primary Examiner* — Jenny L Wagner
(74) *Attorney, Agent, or Firm* — Kratz, Quintos & Hanson, LLP

(57) ABSTRACT

In a method of manufacturing an electronic component built-in substrate of the present invention, a mounted body including a first insulating layer, a stopper metal layer formed under the first insulating layer of a portion corresponding to a component mounting region and a second insulating layer formed on a lower surface of the first insulating layer and covering the stopper metal layer is prepared, and a concave portion is obtained by penetration-processing a portion of the first insulating layer, which corresponds to the component mounting region to form an opening portion, while using the stopper metal layer as a stopper. Also, the stopper metal layer in the concave portion is removed, then an electronic component is mounted on the concave portion, and then a third insulating layer is formed on the electronic component.

8 Claims, 13 Drawing Sheets

(reduced plan view)

METHOD OF MANUFACTURING ELECTRONIC COMPONENT BUILT-IN SUBSTRATE

CROSS-REFERENCE TO RELATED APPLICATIONS

This application is based on and claims priority of Japanese Patent Application No. 2008-042621 filed on Feb. 25, 2008, the entire contents of which are incorporated herein by reference.

BACKGROUND OF THE INVENTION

1. Field of the Invention

The present invention relates to a method of manufacturing an electronic component built-in substrate and, more particularly, a method of manufacturing an electronic component built-in substrate in which a passive component, a semiconductor chip, or the like is mounted to be embedded in an insulating layer.

2. Description of the Related Art

In the prior art, there is the electronic component built-in substrate in which the electronic component such as the capacitor, or the like is mounted to be embedded in the insulating layer. As a first method of manufacturing an electronic component built-in substrate in the prior art, as shown in FIG. 1A, first, a core substrate 100 in which a wiring layer 140 is provided to both surface sides respectively is prepared. Through holes TH are provided in the core substrate 100, and a through electrode 120 is provided in the through holes TH respectively. The wiring layers 140 on both surface sides of the core substrate 100 are connected mutually via the through electrodes 120.

Then, as shown in FIG. 1B, a capacitor component 200 having connection electrodes 220 on both end sides is prepared. The connection electrodes 220 on both end sides of the capacitor component 200 are connected to the wiring layer 140 on the upper surface side of the core substrate 100 with solder 240.

Then, as shown in FIG. 1C, an insulating spacer 300 in which an opening portion 320 whose area is one size larger than an area of the capacitor component 200 is provided and whose thickness corresponds to a thickness of the capacitor component 200 is prepared. The insulating spacer 300 is secured on the core substrate 100 such that the capacitor component 200 is arranged in the opening portion 320. Thus, a level difference of the capacitor component 200 is almost eliminated by a thickness of the insulating spacer 300.

Then, as shown in FIG. 1D, a semi-cured resin film 400 is bonded by pressure on the capacitor component 200 and the insulating spacer 300. Then, as shown in FIG. 1E, the semi-cured resin film 400 is cured by the heat treatment while causing to flow, and thus an interlayer insulating layer 500 formed by the insulating spacer 300 and the resin film 400 is obtained. Accordingly, the whole of the capacitor component 200 is embedded in the interlayer insulating layer 500.

As a second method of manufacturing an electronic component built-in substrate in the prior art, as shown in FIG. 2A, the connection electrodes 220 of the capacitor component 200 are connected to the wiring layer 140 on the core substrate 100 with solder 240, like FIG. 1A. Then, as shown in FIG. 2B, a semi-cured resin film 420 is bonded by pressure on the capacitor component 200, and thus the capacitor component 200 is embedded in the semi-cured resin film 420. Then, as shown in FIG. 2C, the resin film 420 is cured by the heat treatment, and thus the interlayer insulating layer 500 in which the whole of the capacitor component 200 is embedded is obtained.

As the technology related with the above prior art, in Patent Literature 1 (Patent Application Publication (KOKAI) 2007-116155), it is set forth that, in the method of manufacturing the electronic component built-in substrate, a warp of the substrate is prevented by mounting the molded passive component into the cavity formed in the substrate.

Also, in Patent Literature 2 (Patent Application Publication (KOKAI) 2005-302854), it is set forth that the through hole is formed to pass through an insulating layer on one surface of which the copper foil is pasted and on other surface of which the adhesive layer is provided, then the electronic component to both ends of which the solder terminal portions are provided is inserted into the through hole, and then the copper foil is pasted to the adhesive layer, whereby the component built-in both sides substrate in which the interlayer connection is achieved via the electronic component is obtained.

In the above first method of manufacturing an electronic component built-in substrate in the prior art (FIGS. 1A to 1E), in order to eliminate a level difference of the capacitor component 200, the insulating spacer 300 in which the opening portion 320 is formed by the machining must be prepared in advance. Therefore, the number of man-hours in processes is increased. Also, when an adhering function should be provided to the insulating spacer 300, the semi-cured resin film must be used as the insulating spacer 300. But it is difficult to form the opening portion in the semi-cured resin film by the machining. Therefore, such approach cannot be easily applied to various processes.

Further, the opening portion 320 in the insulating spacer 300 must be aligned with the capacitor component 200. Therefore, when particularly the capacitor component should be reduced in size, it is extremely difficult to align them mutually with good accuracy.

Also, in the above first method of manufacturing an electronic component built-in substrate in the prior art (FIGS. 2A to 2C), at a time the interlayer insulating layer 500 is obtained by embedding the capacitor component 200 in the semi-cured resin film 420, it is difficult to eliminate sufficiently a level difference of the capacitor component 200. In many cases, a level difference still remains on the upper surface of the interlayer insulating layer 500. Therefore, at a time the wiring layer is formed on the interlayer insulating layer 500, it is difficult to form the wiring layer with good accuracy. Also, such a problem exists that a warp is ready to occur due to a different in a coefficient of thermal expansion between the core substrate 100 and the interlayer insulating layer 500, and others.

SUMMARY OF THE INVENTION

It is an object of the present invention to provide a method in which a level difference of an electronic component can be eliminated easily to cause no problem, in a method of manufacturing an electronic component built-in substrate in which an electronic component is mounted to be embedded in an insulating layer.

The present invention is concerned with a method of manufacturing an electronic component built-in substrate including a structure in which an electronic component is mounted in a concave portion provided in a mounted body, which includes the steps of, preparing the mounted body including a first insulating layer and a stopper metal layer formed under the first insulating layer of a portion corresponding to a component mounting region, and obtaining the concave portion by penetration-processing the portion of the first insulating layer, which corresponds to the component mounting region to form an opening portion, while using the stopper metal layer as a stopper.

In the mounted body used in the manufacturing method of the present invention, the stopper metal layer acting as a stopper in the laser processing, or the like is provided to the portion of the lower surface of the first insulating layer (the core substrate, or the like), the portion which corresponds to the component mounting region. Then, while using the stopper metal layer as a stopper, the opening portion is formed by penetration-processing the first insulating layer, thereby the concave portion is obtained. Since such approach is employed, a depth of the concave portion is decided by a thickness of the first insulating layer, and therefore a variation in depth of the concave portion can be suppressed.

In one preferred mode of the present invention, a second insulating layer for covering the stopper metal layer is formed on the lower surface of the first insulating layer (the core substrate, or the like). The stopper metal layer exposed from the bottom surface of the concave portion may be removed, or may be made patterns and thereby connection pads are arranged, or may be left as it is.

When the stopper metal layer is removed, the second insulating layer is exposed from the bottom portion of the concave portion. Then, when the electronic component (the capacitor component, the semiconductor chip, or the like) is mounted on the second insulating layer, a level difference of the electronic component can be eliminated by the concave portion. Also, a third insulating layer is formed on the electronic component, and the electronic component is embedded in the insulating layer. Then, first via holes whose depth reaches the connection terminals of the electronic component are formed on the second insulating layer or the third insulating layer (or both insulating layers), and then a second wiring layer connected to the connection terminals of the electronic component via the first via holes is formed on the second insulating layer or the third insulating layer (or both insulating layers).

Also, in one preferred mode of the present invention, a first wiring layer connected mutually via through electrodes is formed on both surface sides of the first insulating layer, and the stopper metal layer is formed of the identical layer with the first wiring layer on the lower surface side of the first insulating layer. In this case, second via holes whose depth reaches the first wiring layer are formed in the second and third insulating layers at the time that the first via holes are formed, and the second wiring layer is connected to the first wiring layer via second via holes.

Also, when the stopper metal layer of the bottom portion of the concave portion of the mounted body is made patterns and thereby connection pads are arranged, the connection terminals of the electronic component are connected to the connection pads. Also, the first via holes whose depth reaches the connection pads are formed in the second insulating layer, and the second wiring layer connected to the connection pads via the first via holes is formed on the second insulating layer.

Also, when all of the stopper metal layer of the bottom portion of the concave portion of the mounted body is left, the lower electrodes of the parallel-plate type passive component are mounted to be connected to the stopper metal layer. Also, the first via holes whose depth reaches the stopper metal layer are formed in the second insulating layer, and the second wiring layer connected to the stopper metal layer via the first via holes is formed on the second insulating layer. Also, the first via holes whose depth reaches the upper electrodes of the passive component are formed in the third insulating layer, and the second wiring layer connected to the upper electrodes via the first via holes is formed on the third insulating layer.

Otherwise, a back surface of the semiconductor chip may be secured onto the stopper metal layer by the adhesive.

In a preferred mode of the present invention, the electronic component built in the first insulating layer is put between the second insulating layer and the third insulating layer to constitute a symmetrical structure with the electronic component as an axis of symmetry. Therefore, even when the core substrate (a resin into which a glass cloth is contained, or the like) is used as the first insulating layer, the structure that is resistant to a warp can be obtained by forming the second insulating layer and the third insulating layer from the identical material.

Further, the first to third insulating layers can be formed of the identical material. In this case, thermal expansion coefficients of the insulating layers around the electronic component can be set equally, and therefore the occurrence of warp can be suppressed further.

As explained above, in the present invention, the electronic component can be mounted to be embedded in the insulating layer while eliminating easily a level difference of the electronic component to cause no problem.

DETAILED DESCRIPTION OF THE PREFERRED EMBODIMENTS

Embodiments of the present invention will be explained with reference to the accompanying drawings hereinafter.

First Embodiment

Figure 1A:
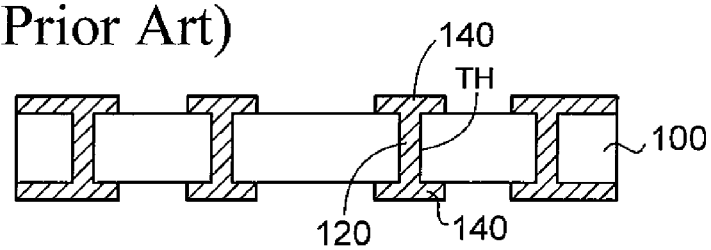
FIGS. 1A to 1E are sectional views showing a first method of manufacturing an electronic component built-in substrate in the prior art.
Figure 1B:
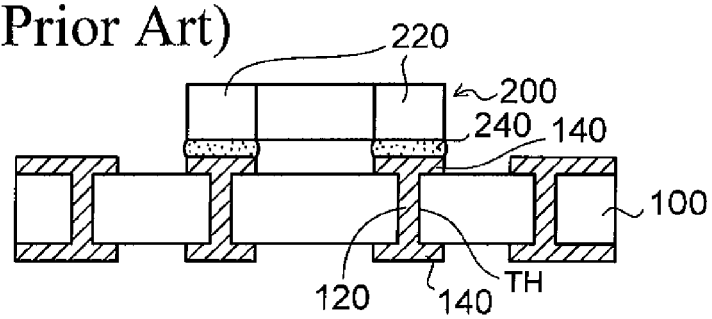
Figure 1C:
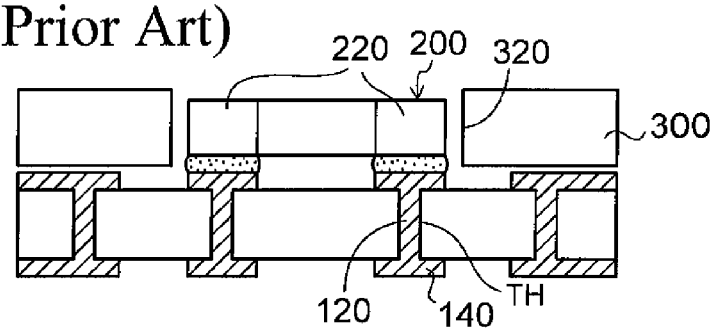
Figure 1D:
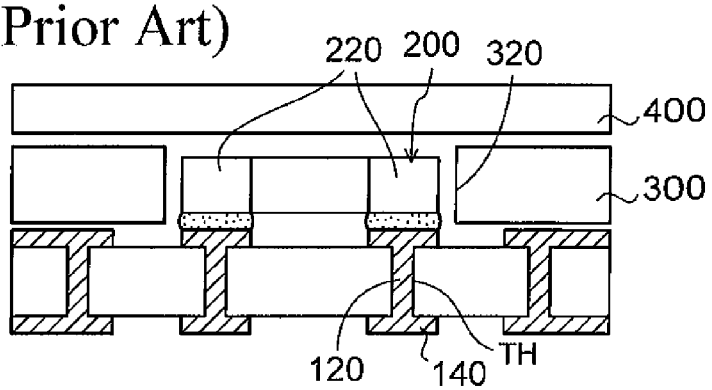
Figure 1E:
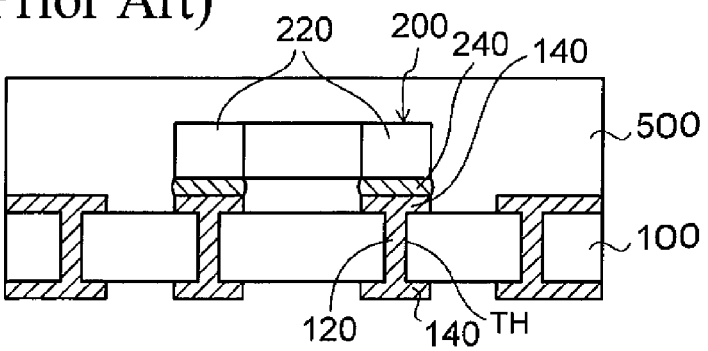
Figure 2A:
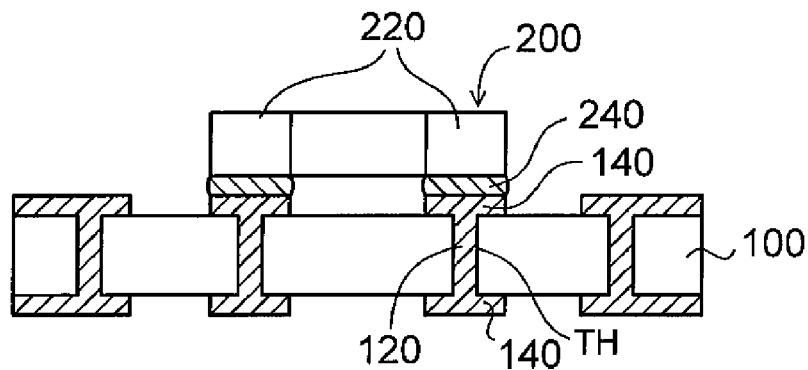
FIGS. 2A to 2C are sectional views showing a second method of manufacturing an electronic component built-in substrate in the prior art.
Figure 2B:
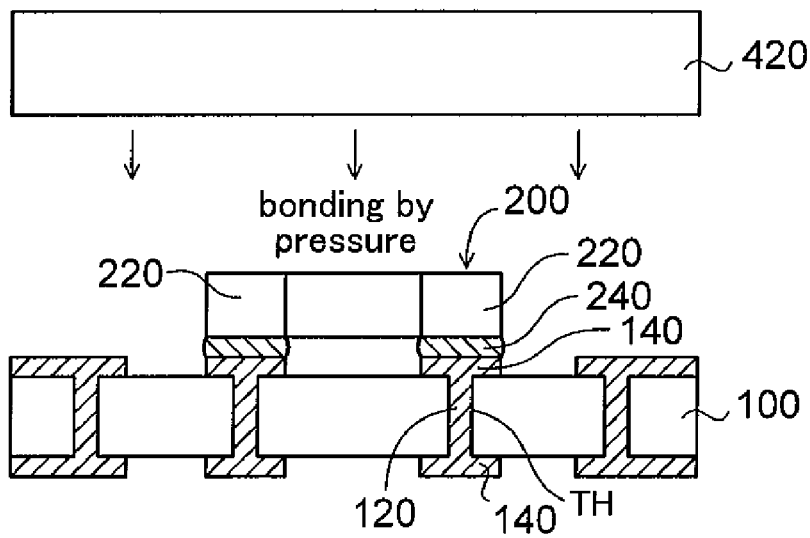
Figure 2C:
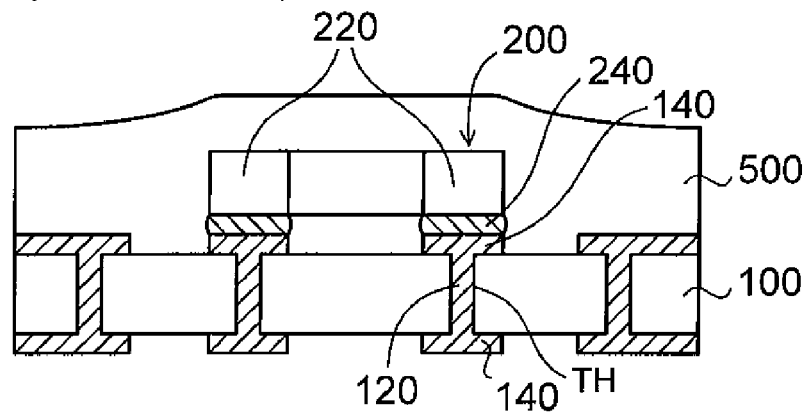
Figure 3A:
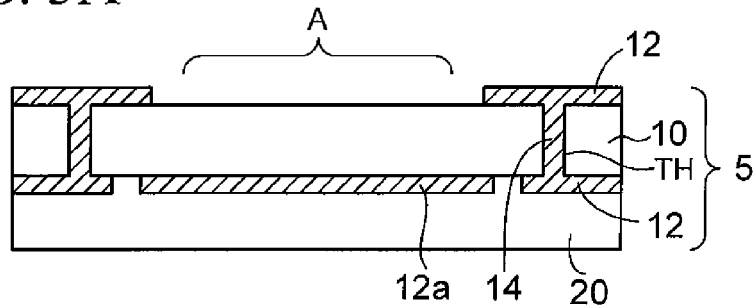
FIGS. 3A to 3D are sectional views (including a plan view in part) (#1) showing a method of manufacturing an electronic component built-in substrate according to a first embodiment of the present invention.

FIGS. 3A to 3D, FIGS. 4A to 4C, and FIGS. 5A to 5C are sectional views showing a method of manufacturing an electronic component built-in substrate according to a first embodiment of the present invention. In the method of manufacturing the electronic component built-in substrate according to the present embodiment, as shown in FIG. 3A, first, a core substrate 10 on both surface sides of which a first wiring layer 12 is provided respectively is prepared. The core substrate 10 is formed of an epoxy resin into which a glass cloth is contained, or the like, and through holes TH passing through the thickness direction are formed in the core substrate 10. A through electrode 14 is filled in the through holes TH of the core substrate 10 respectively, and the first wiring layers 12 on both surface sides of the core substrate 10 are connected mutually via the through electrodes 14.

Alternately, a through hole plating layer may be provided on inner surfaces of the through holes TH of the core substrate 10 respectively, and a resin may be filled in holes of the inside thereof, and the first wiring layers 12 on both surface sides of the core substrate 10 may be connected mutually via the through hole plating layers.

A component mounting area A on which an electronic component is mounted is defined on the core substrate 10. The first wiring layer 12 is not arranged in the component mounting area A on the upper surface side of the core substrate 10 whereas a stopper metal layer 12a is formed in an area corresponding to the component mounting area A on the lower surface side of the core substrate 10.

As described later, the stopper metal layer 12a functions as a stopper in forming a concave portion by penetration-processing the component mounting area A of the core substrate 10.

An area of the stopper metal layer 12a is set one size larger than an area of the component mounting area A. Also, the stopper metal layer 12a is formed of the identical layer with the first wiring layer 12 provided on the lower surface side of the core substrate 10. As the material of the first wiring layer 12 and the stopper metal layer 12a, the metal material such as copper, or the like, which can be used as the wiring, is used.

The component mounting area A of the core substrate 10 may be defined as one area on the substrate. Otherwise, a large-size substrate for multiple production may be used as the core substrate 10 and a plurality of component mounting areas A may be defined on the substrate.

Also, a lower interlayer insulating layer 20 for covering the first wiring layer 12 is formed on the lower surface of the core substrate 10. The lower interlayer insulating layer 20 is formed by pasting a resin film on the lower surface of the core substrate 10, or the like.

In the present embodiment, a structure in FIG. 3A is used as a mounted body 5 on which the electronic component is to be mounted. The core substrate 10 is an example of the first insulating layer, and the lower interlayer insulating layer 20 is an example of the second insulating layer.

Figure 3B:
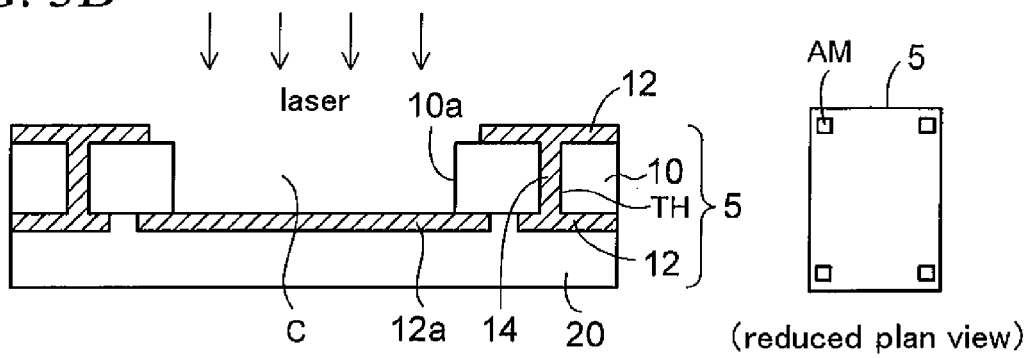

Then, as shown in FIG. 3B, the component mounting area A of the core substrate 10 is penetration-processed by the laser while using the stopper metal layer 12a as a stopper, and thus an opening portion 10a is formed on the stopper metal layer 12a. Accordingly, a concave portion C (cavity) constructed by side surfaces of the opening portion 10a of the core substrate 10 and an upper surface of the stopper metal layer 12a is provided in the mounted body 5. In general, the laser has such characteristic to be easy to process the resin material and to be hard to process the metal layer such as copper, or the like. Therefore, when the stopper metal layer 12a is exposed after the laser processing of the core substrate 10 is completed, the laser processing mainly stops at the stopper metal layer 12a.

Therefore, a depth of the concave portion C is decided by a thickness of the core substrate 10, and thus the concave portion C having a desired depth can be formed stably. Also, even when the large-size substrate for the multiple production is used, a variation in depth between a plurality of concave portions provided in the substrate can be suppressed.

Unlike the present embodiment, when the concave portion should be formed by the laser processing up to the middle of the thickness of the core substrate 10, it is difficult to control a depth and a depth of the concave portion is ready to vary considerably. Also, since the laser processing applied to the resin material takes relatively much time, in many cases a laser power is set large. In such case, a variation of depth of the concave portion becomes more conspicuous.

In the present embodiment, even when a laser power is set large, the laser processing stops at the stopper metal layer 12a. As a result, there is no need to take the depth control into consideration, and the present embodiment can also contribute to improvement of production efficiency.

As the laser, a $CO_2$ laser, a YAG laser, or the like is used. In a situation that a higher processing selectivity between the core substrate 10 and the stopper metal layer 12a is needed, it is preferable that the $CO_2$ laser should be used.

Also, as shown in a reduced plan view in FIG. 3B, an alignment mark AM formed of the identical layer with the first wiring layer 12 is arranged at four corners on the upper surface side of the mounted body 5. when the component mounting area A of the core substrate 10 is laser processed, an aligning mechanism of the laser device detects the alignment marks AM, so that the laser can be aligned with the component mounting area A based on this detection with good accuracy. As a result, even when the downsized electronic component should be mounted, the opening portion 10a can be formed in the component mounting area A of the core substrate 10 by the laser with good accuracy so as to correspond to such electronic component.

In this case, the component mounting area A of the core substrate 10 may be processed by the etching (the wet etching or the dry etching), instead of processing of the core substrate 10 by the laser. In this case, in etching the core substrate 10, the etching can be also stopped mainly by the stopper metal layer 12a. When the etching is applied, a mask (resist, or the like) in which an opening portion is provided in the component mounting area A is formed on the upper surface of the core substrate 10, and then the core substrate 10 is etched through the opening portion of the mask.

Figure 3C:
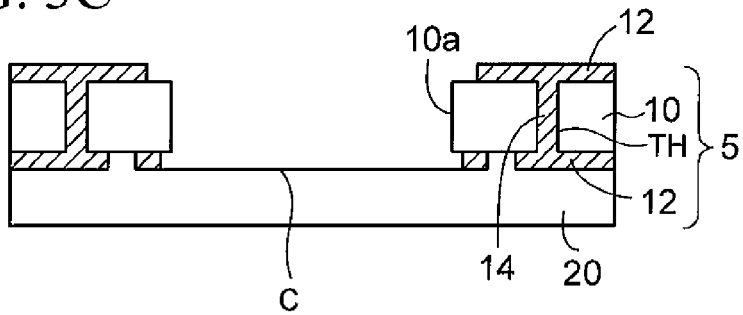

Then, as shown in FIG. 3C, the stopper metal layer 12a exposed from a bottom portion of the concave portion C of the mounted body 5 is removed by the wet etching, or the like. Accordingly, such state is obtained that an upper surface of the lower interlayer insulating layer 20 is exposed from the bottom portion of the concave portion C.

Figure 3D:
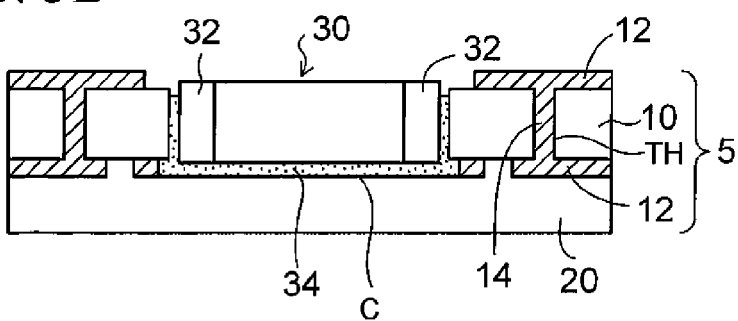

Then, as shown in FIG. 3D, a capacitor component 30 (an electronic component) on both end sides of which connection terminals 32 are provided respectively is prepared. As the capacitor component 30 having such structure, there is a multilayer ceramic capacitor, or the like, for example. Also, the capacitor component 30 is mounted to be bonded to the concave portion C of the mounted body 5 with an adhesive 34 such that the connection terminals 32 are aligned in the horizontal direction.

At this time, the adhesive 34 is filled in a clearance between side surfaces of the capacitor component 30 and side surfaces of the concave portion C of the mounted body 5. Also, the capacitor component 30 can be mounted on the concave portion C by the mounter with good accuracy by using the alignment marks AM described above.

In the first embodiment, all of the stopper metal layer 12a of the bottom portion of the concave portion C is removed. Therefore, even though the connection terminals 32 of the capacitor component 30 contact the bottom portion of the concave portion C, there is no possibility that the connection terminals 32 on both end sides of the capacitor component 30 are electrically short-circuited.

In the present embodiment, the capacitor component 30 is illustrated as the electronic component. A passive component such as a resistor, an inductor, or the like having similar connection terminals may be mounted.

Figure 4A:
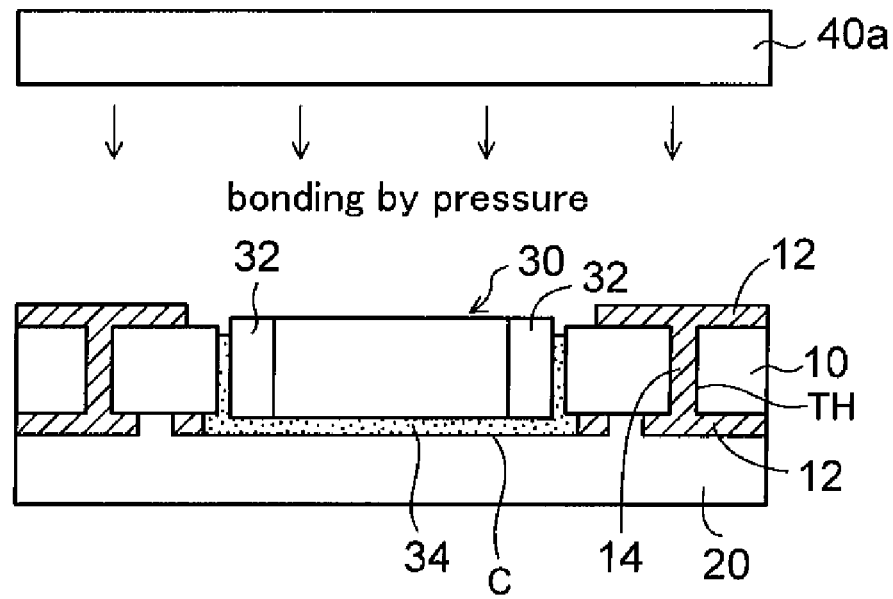
FIGS. 4A to 4C are sectional views (#2) showing a method of manufacturing the electronic component built-in substrate according to the first embodiment of a present invention.
Figure 4B:
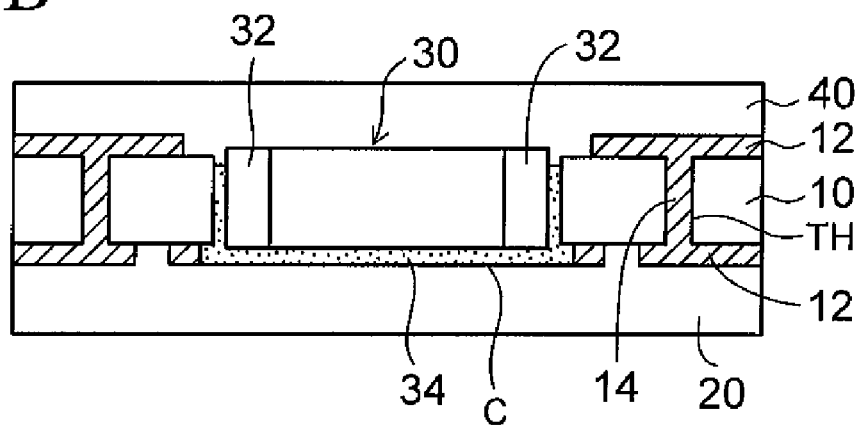

Then, as shown in FIG. 4A, a semi-cured resin film 40a is bonded by pressure to the upper surface side of the core substrate 10 with pressure, and then is thermally treated. Thus, as shown in FIG. 4B, the semi-cured resin film 40a is cured while flowing, and thus an upper interlayer insulating layer 40 (third insulating layer) for covering the capacitor component 30 is formed on the upper surface side of the core substrate 10. Since the capacitor component 30 is mounted on the concave portion C and the level difference is eliminated, the upper interlayer insulating layer 40 is formed in a state that its upper surface is flat.

In this manner, the capacitor component 30 is built in the inside of the core substrate 10, and also this capacitor component 30 is put between the upper interlayer insulating layer 40 and the lower interlayer insulating layer 20.

Figure 4C:
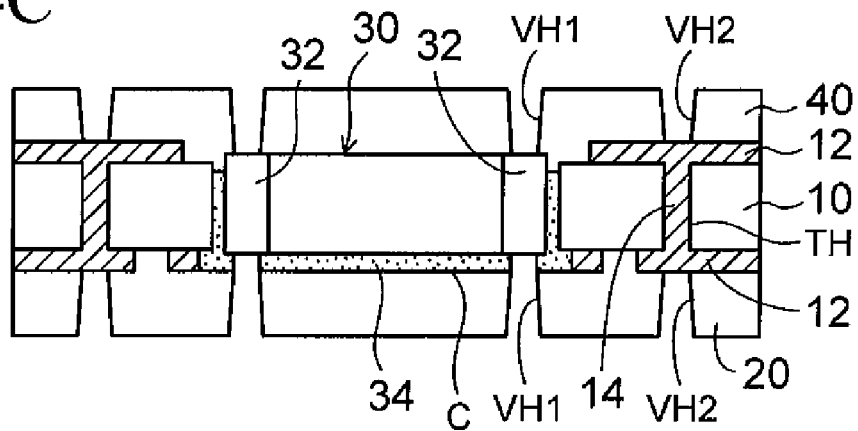

Then, as shown in FIG. 4C, the upper interlayer insulating layer 40 is processed by the laser. Thus, first via holes VH1 whose depth arrives at the upper surfaces of the connection terminals 32 on both end sides of the capacitor component 30 are formed, and also second via holes VH2 whose depth arrives at the first wiring layer 12 on the upper surface side of the core substrate 10 are formed. Similarly, the lower interlayer insulating layer 20 and the adhesive 34 are processed by the laser. Thus the first via holes VH1 whose depth arrives at the lower surfaces of the connection terminals 32 on both end sides of the capacitor component 30 are formed. Also, the lower interlayer insulating layer 20 is processed by the laser. Thus the second via holes VH2 whose depth arrives at the first wiring layer 12 on the lower surface side of the core substrate 10 are formed.

Figure 5A:
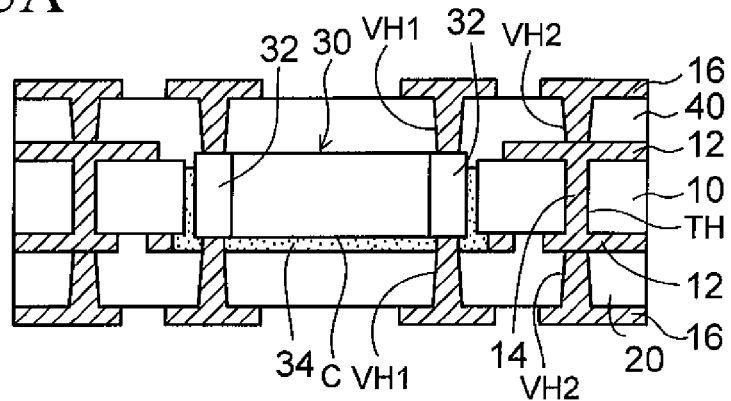
FIGS. 5A to 5C are sectional views (#3) showing a method of manufacturing the electronic component built-in substrate according to the first embodiment of the present invention.

Then, as shown in FIG. 5A, a second wiring layer 16 is formed on the upper interlayer insulating layer 40 and the lower interlayer insulating layer 20 on both surface sides of the core substrate 10 respectively. The second wiring layer 16 is connected to the connection terminals 32 of the capacitor component 30 via the first via holes VH1 and also is connected to the first wiring layer 12 of the core substrate 10 via the second via holes VH2.

As the method of forming the second wiring layer 16, for example, the semi-additive process is employed. To explain in more detail, first, a seed layer (not shown) is formed in the inner surfaces of the first and second via holes VH1, VH2 and the upper and lower interlayer insulating layers 40, 20 on both surface sides of the core substrate 10.

Then, a plating resist (not shown), in which an opening is provided in the portions on which the second wiring layer 16 is arranged, is formed on the seed layer. Then, a metal plating layer is formed in the first and second via holes VH1, VH2 and in opening portions in the plating resist by the electroplating utilizing the seed layer as a plating power feeding path. Then, the plating resist is removed, and then the seed layer is etched by using the metal plating layer as a mask.

In FIG. 5A, such a mode is illustrated that two wiring layers (the first and second wiring layers 12, 16) are stacked on both surface sides of the core substrate 10 respectively. But the stacked number of the wiring layers can be set arbitrarily.

Figure 5B:
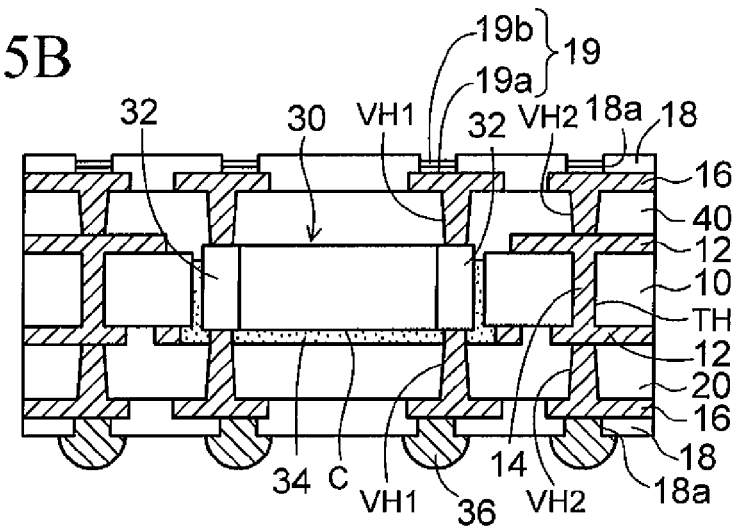

Then, as shown in FIG. 5B, a solder resist 18 in which opening portions 18a are provided on pads of the second wiring layer 16 is formed on both surface sides of the core substrate 10 respectively.

Then, Ni plating layer 19a/Au plating layer 19b are formed sequentially from the bottom on pads of the second wiring layer 16 in the opening portions 18a of the solder resist 18 on both surface sides of the core substrate 10, and thus connecting portions 19 are obtained (they are not shown in the lower surface side of the core substrate 10). Then, external connection terminals 36 are formed by mounting a solder ball on the connecting portions of the second wiring layer 16 on the lower surface side of the core substrate 10, or the like.

Figure 5C:
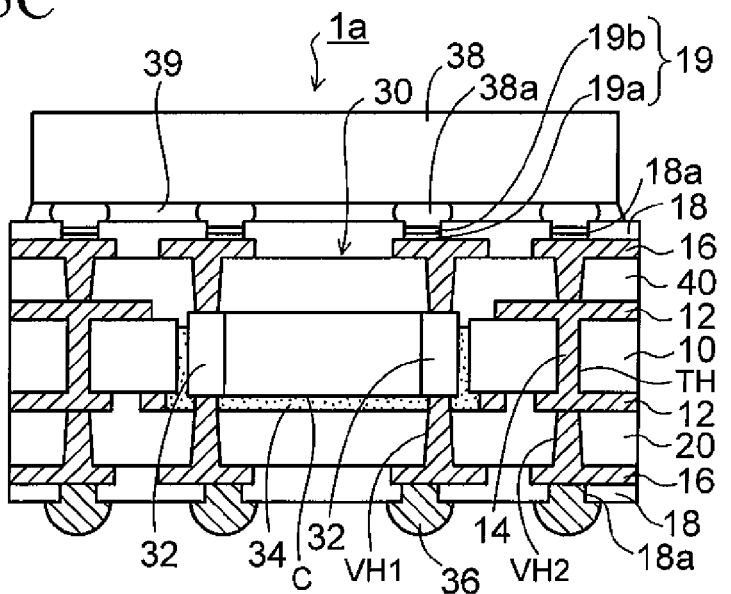

Then, as shown in FIG. 5C, bumps 38a of a semiconductor chip 38 are flip-chip connected to the connecting portions of the second wiring layer 16 on the upper surface side of the core substrate 10 respectively. Then, an underfill resin 39 is filled into a clearance under the semiconductor chip 38.

As a result, an electronic component built-in substrate 1a (a semiconductor device) according to the first embodiment is obtained.

In this case, the electronic component built-in substrate of the present embodiment can be applied to a motherboard, or the like based on the structure in FIG. 5A.

As explained above, in the method of manufacturing the electronic component built-in substrate of the present embodiment, first, the mounted body 5 having such a structure that the lower interlayer insulating layer 20 (second insulating layer) is formed under the core substrate 10 (first insulating layer), which has the first wiring layer 12 being connected mutually on both surface sides, is prepared. The stopper metal layer 12a formed of the identical layer with the first wiring layer 12 is formed on the lower surface of the core substrate 10 corresponding to the component mounting area A.

Then, the component mounting area A of the core substrate 10 is penetration-processed by the laser while using the stopper metal layer 12a as the stopper of the laser processing, and thus the opening portion 10a is formed in the core substrate 10. Accordingly, the concave portion C is provided in the mounted body 5. In the present embodiment, the stopper metal layer 12a is utilized as the stopper of the laser processing, and thus a depth of the concave portion C is decided by a thickness of the core substrate 10. Therefore, the concave portion C having a desired depth can be formed stably.

Then, in the present embodiment, all of the stopper metal layer 12a of the bottom portion of the concave portion C is removed. Then, the capacitor component 30 is mounted on the concave portion C, and then the upper interlayer insulating layer 40 (the third insulating layer) is formed on the capacitor component 30. Thus, the capacitor component 30 is built in and embedded in the core substrate 10.

In the present embodiment, the capacitor component 30 built in the opening portion 10a of the core substrate 10 can be sandwiched between the lower interlayer insulating layer 20 and the upper interlayer insulating layer 40 both being formed of the identical resin material. As the resin material of the lower interlayer insulating layer 20 and the upper interlayer insulating layer 40, an epoxy resin, a polyimide resin, or the like is used preferably.

Accordingly, the electronic component built-in substrate 1a of the present embodiment has such a structure that the interlayer insulating layer 20, 40 are arranged symmetrically with the capacitor component 30 (the core substrate 10) as an axis of symmetry. As a result, even when a thermal stress is caused based on a difference in a coefficient of thermal expansion between the capacitor component 30, the core substrate 10, and the upper and lower interlayer insulating layers 40, 20, such thermal stress can be cancelled mutually, so that occurrence of the warp can be prevented.

Also, in the present embodiment, unlike the prior art, neither the electronic component is embedded in the semi-cured resin film nor the insulating having the opening portion is used. Therefore, the core substrate 10 and the upper and lower interlayer insulating layers 40, 20 can be formed of the identical material (glass-cloth contained resin, prepreg, or the like). In the case in this mode, a coefficient of thermal expansion of the insulating layers around the electronic component can be set equally, and thus occurrence of the warp can be further prevented.

Then, the first and second via holes VH1, VH2 whose depth arrives at the connection terminals 32 of the capacitor component 30 and the first wiring layer 12 are formed in the upper and lower interlayer insulating layers 40, 20 on both surface sides of the core substrate 10 respectively. Then, the second wiring layer 16 which is connected to the connection terminals 32 of the capacitor component 30 and the first wiring layer 12 via the first and second via holes VH1, VH2 is formed on the upper and lower interlayer insulating layers 40, 20 on both surface sides of the core substrate 10 respectively.

In the present embodiment, after the capacitor component 30 is built in the core substrate 10, the multi-layered wiring layer can be formed by utilizing the common technology of the build-up wiring. Therefore, the existing manufacturing line can be used commonly, and the present embodiment is advantageous in such an aspect that a huge capital investment can be avoided.

In the present embodiment, the core substrate 10 is illustrated as the first insulating layer in which the concave portion is formed. In this case, the stopper metal layer may be formed beneath the interlayer insulating layer upon forming the build-up wiring on the core substrate, then the concave portion may be formed by penetration-processing the interlayer insulating layer, and then similarly the electronic component may be mounted in the concave portion.

Also, as the first insulating layer in which the concave portion is formed, a rigid substrate (the core substrate 10) is illustrated. But a flexible substrate may be employed.

Second Embodiment

FIGS. 6A to 6C and FIGS. 7A and 7B are sectional views showing a method of manufacturing an electronic component built-in substrate according to a second embodiment of the present invention.

In the second embodiment, a semiconductor chip is mounted instead of the capacitor component in the first embodiment. In the second embodiment, detailed explanation about the same steps as those in the first embodiment will be omitted herein.

Figure 6A:
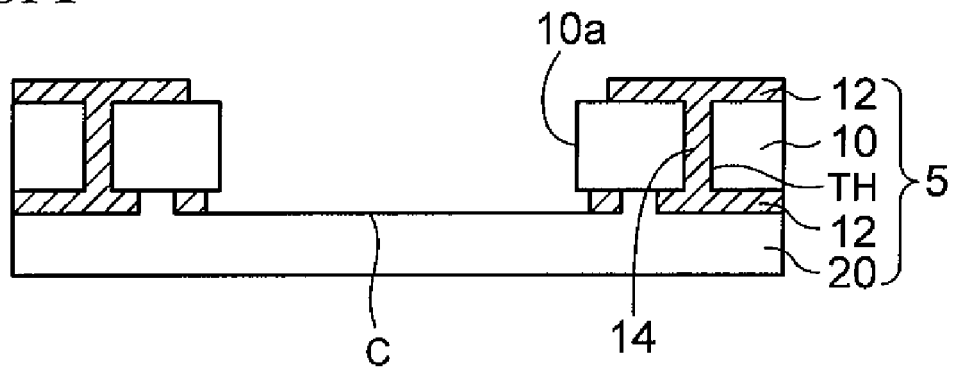
FIGS. 6A to 6C are sectional views (#1) showing a method of manufacturing an electronic component built-in substrate according to a second embodiment of the present invention.

In the method of manufacturing the electronic component built-in substrate according to the second embodiment, as shown in FIG. 6A, first, a structure in which the stopper metal layer 12a of the bottom portion of the concave portion C of the mounted body 5 is removed is obtained, like FIG. 3C of the first embodiment.

Figure 6B:
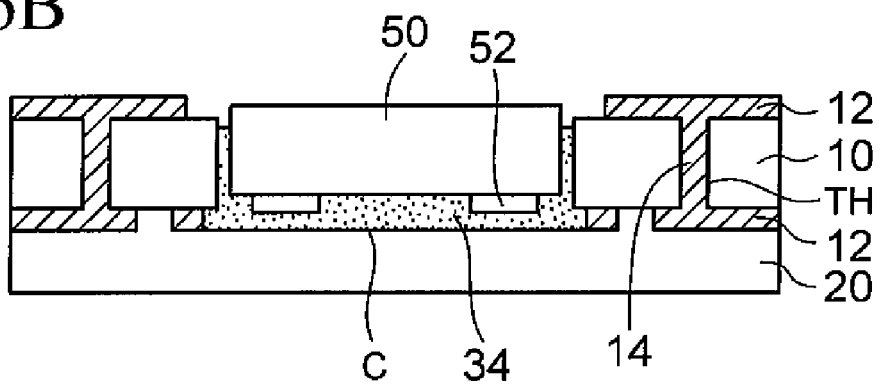

Then, as shown in FIG. 6B, a semiconductor chip 50 (LSI chip) having connection terminals 52 (connection pads or connection bumps) is prepared. Then, the semiconductor chip 50 is mounted/bonded on the concave portion C of the mounted body 5 by the adhesive 34 while directing the connection terminals 52 downward (face-down).

Figure 6C:
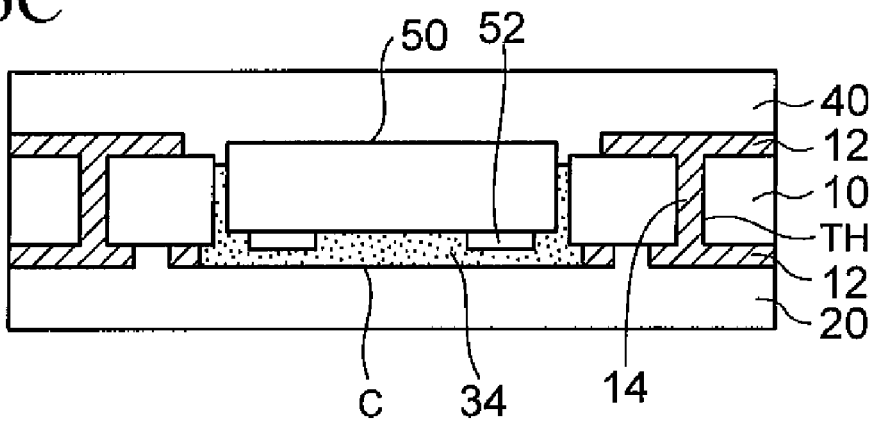

Then, as shown in FIG. 6C, like the first embodiment, the upper interlayer insulating layer 40 is formed on the core substrate 10 and the semiconductor chip 50.

Figure 7A:
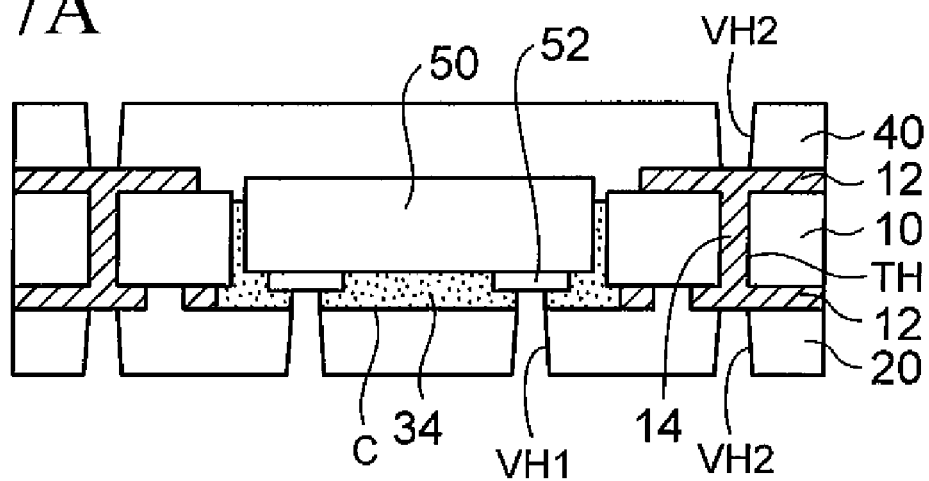
FIGS. 7A and 7B are sectional views (#2) showing a method of manufacturing the electronic component built-in substrate according to the second embodiment of the present invention.

Then, as shown in FIG. 7A, the first via holes VH1 whose depth reaches the connection terminals 52 of the semiconductor chip 50 are formed by laser processing the lower interlayer insulating layer 20 and the adhesive 34. Also, the second via holes VH2 whose depth reaches the first wiring layer 12 on the lower surface side of the core substrate 10 are formed by laser processing the lower interlayer insulating layer 20. Also, the second via holes VH2 whose depth reaches the first wiring layer 12 on the upper surface side of the core substrate 10 are formed by laser processing the upper interlayer insulating layer 40.

In this case, when the damage to the semiconductor chip 50 by the laser radiation becomes an issue, a mask (such as a resist, or the like) in which opening portions are provided is formed, and then the lower interlayer insulating layer 20 and the adhesive 34 are dry-etched through the opening portions. Thus, also the first via holes VH1 can be formed.

Figure 7B:
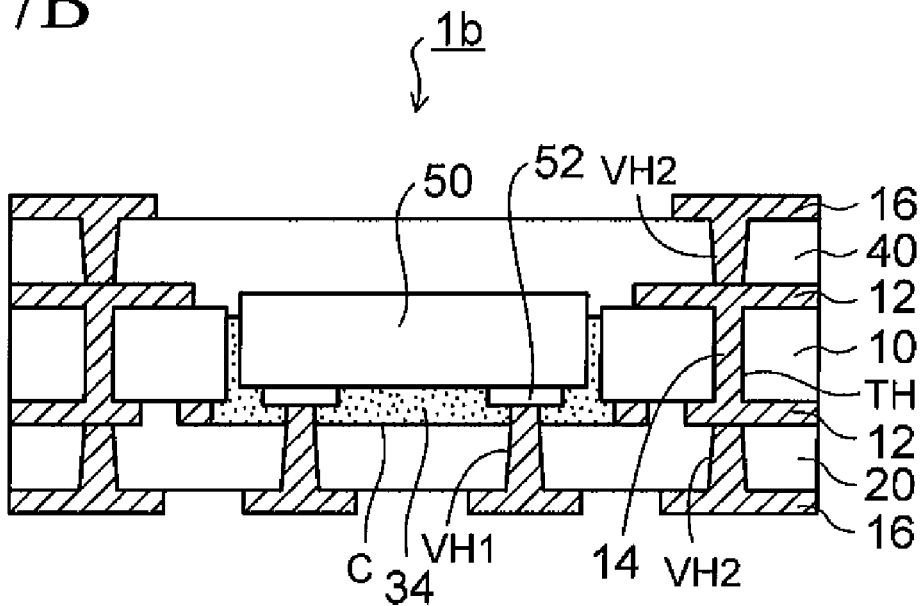

Then, as shown in FIG. 7B, according to the similar method to the first embodiment, the second wiring layer 16 that is connected to the connection terminals 52 of the semiconductor chip 50 via the first via holes VH1 and also connected to the first wiring layer 12 on the lower surface side of the core substrate 10 via the second via holes VH2 is formed on the lower interlayer insulating layer 20. Also, the second wiring layer 16 that is connected to the first wiring layer 12 on the upper surface side of the core substrate 10 via the second via holes VH2 is formed on the upper interlayer insulating layer 40.

Accordingly, an electronic component built-in substrate 1b of the second embodiment is obtained. Also, like the first embodiment, this substrate can be applied to the semiconductor device, or the like. The second embodiment can achieve the similar advantages to those in the first embodiment.

Third Embodiment

Figure 8A:
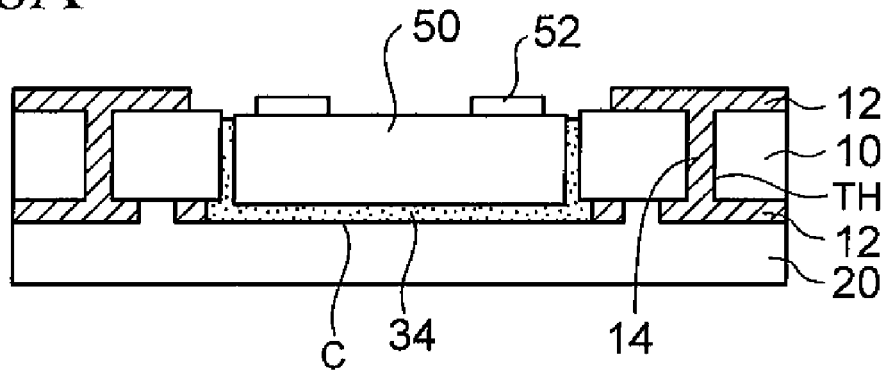
FIGS. 8A to 8C are sectional views showing a method of manufacturing an electronic component built-in substrate according to a third embodiment of the present invention.
Figure 8B:
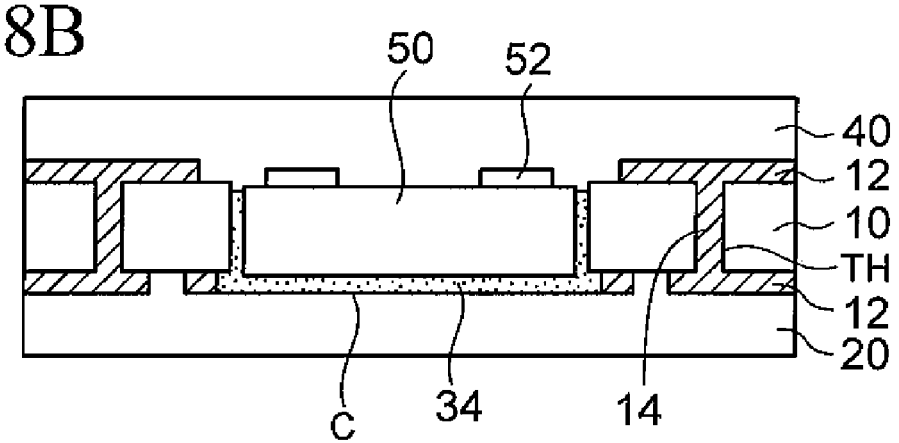
Figure 8C:
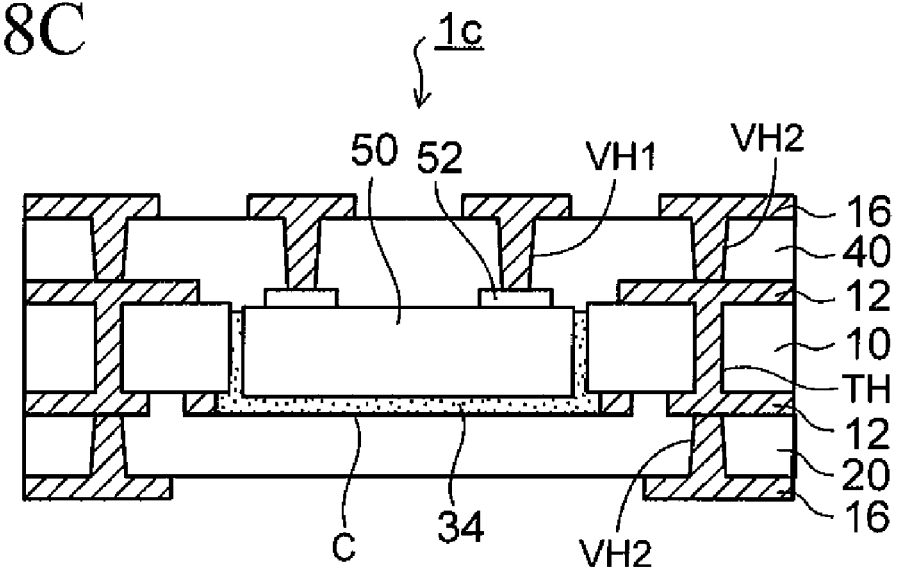

FIGS. 8A to 8C are sectional views showing a method of manufacturing an electronic component built-in substrate according to a third embodiment of the present invention.

In the third embodiment, the semiconductor chip is mounted in a face-up manner in the second embodiment. In the third embodiment, detailed explanation about the same steps as those in the first embodiment will be omitted herein.

In the method of manufacturing an electronic component built-in substrate according to the third embodiment, as shown in FIG. 8A, in the above step in FIG. 6B of the second embodiment, the semiconductor chip 50 is mounted/bonded on the concave portion C of the mounted body 5 by the adhesive 34 while directing the connection terminals 52 upward (face-up).

Then, as shown in FIG. 8B, the upper interlayer insulating layer 40 is formed on the semiconductor chip 50 and the core substrate 10 by the similar method to that in the first embodiment.

Then, as shown in FIG. 8C, the first via holes VH1 whose depth reaches the connection terminals 52 of the semiconductor chip 50 and also the second via holes VH2 whose depth reaches the first wiring layer 12 on the upper surface side of the core substrate 10 are formed in the upper interlayer insulating layer 40. Also, the second via holes VH2 whose depth reaches the first wiring layer 12 on the lower surface side of the core substrate 10 are formed in the lower interlayer insulating layer 20.

Then, the second wiring layer 16 connected to the connection terminals 52 of the semiconductor chip 50 via the first via holes VH1 and also connected to the first wiring layer 12 on the upper surface side of the core substrate 10 via the second via holes VH2 is formed on the upper interlayer insulating layer 40. Also, the second wiring layer 16 connected to the first wiring layer 12 on the lower surface side of the core substrate 10 via the second via holes VH2 is formed on the lower interlayer insulating layer 20.

Accordingly, an electronic component built-in substrate 1c of the third embodiment is obtained. Also, like the first embodiment, this substrate can be applied to the semiconductor device, or the like. The third embodiment can achieve the similar advantages to those of the first embodiment.

Fourth Embodiment

FIGS. 9A to 9D and FIGS. 10A to 10C are sectional views showing a method of manufacturing an electronic component built-in substrate according to a fourth embodiment of the present invention. A feature of the fourth embodiment resides in that, in the first embodiment, the connection pads to which the electronic component is electrically connected are formed by patterning the stopper metal layer of the bottom portion of the concave portion of the mounted body. In the fourth embodiment, detailed explanation about the same steps as those in the first embodiment will be omitted herein.

Figure 9A:
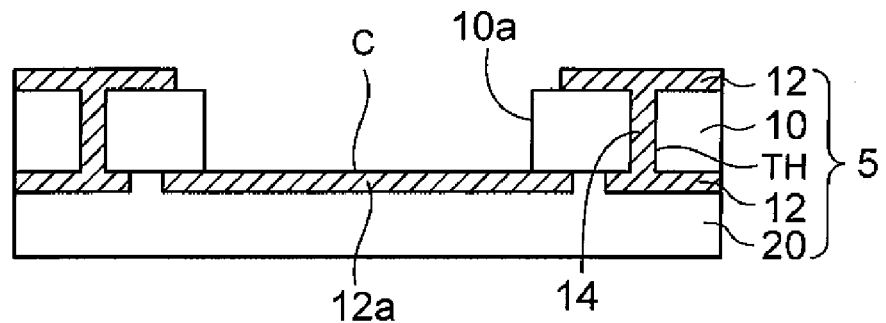
FIGS. 9A to 9D are sectional views (#1) showing a method of manufacturing an electronic component built-in substrate according to a fourth embodiment of the present invention.
Figure 9B:
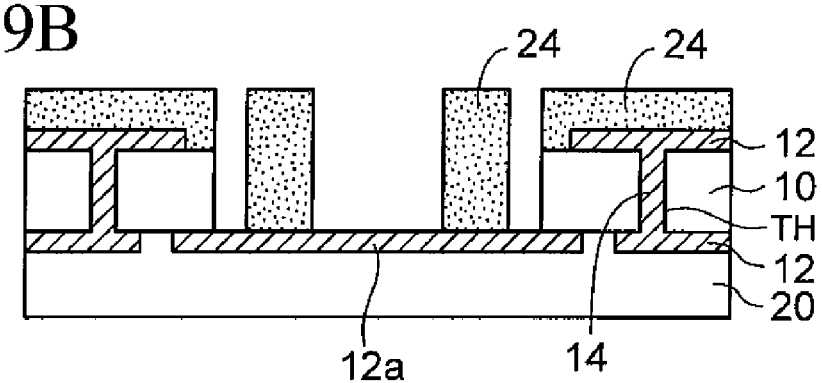

In the fourth embodiment, as shown in FIG. 9A, the same structure as that in FIG. 3B of the first embodiment is obtained. Then, as shown in FIG. 9B, a resist 24 is left as a pattern on portions, on which the connection pads are to be arranged, of the stopper metal layer 12a of the bottom portion of the concave portion C of the mounted body 5. The overall surface of the core substrate 10 except the concave portion C is covered with the resist 24.

Figure 9C:
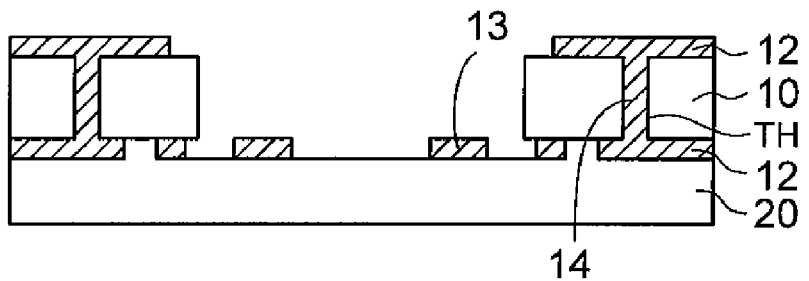

Then, the stopper metal layer 12a is wet-etched while using the resist 24 as a mask, and then the resist 24 is removed. Thus, as shown in FIG. 9C, connection pads 13 are formed on the lower interlayer insulating layer 20 in the concave portion C of the mounted body 5. The connection pads 13 may be connected electrically to the first wiring layer 12 on the lower surface side of the core substrate 10 or may be provided separately from the first wiring layer 12.

Figure 9D:
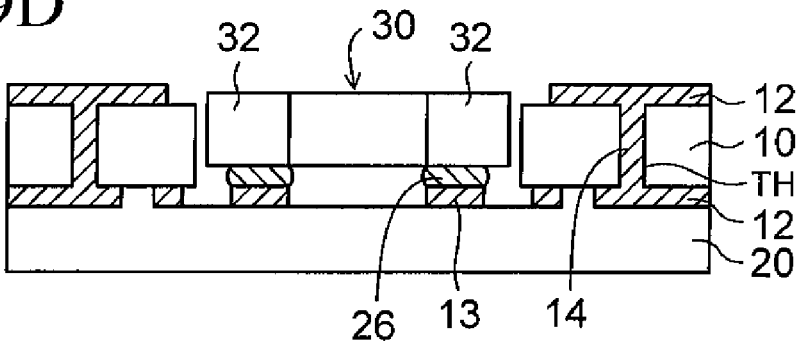

Then, as shown in FIG. 9D, the capacitor component 30 equipped with the connection terminals 32 on both end sides is prepared, like the first embodiment. The capacitor component 30 is mounted by joining the connection terminals 32 of the capacitor component 30 to the connection pads 13 of the mounted body 5 with solder 26. In addition to the solder 26, various conductive pastes can be used.

Figure 10A:
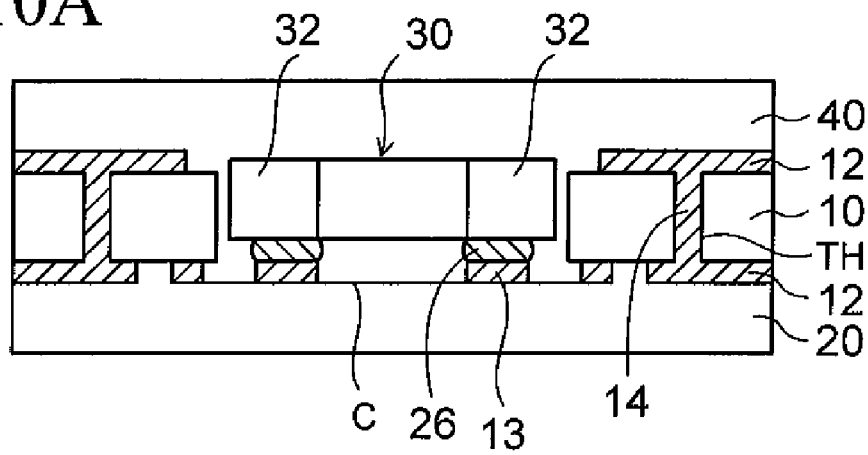
FIGS. 10A to 10C are sectional views (#2) showing a method of manufacturing the electronic component built-in substrate according to the fourth embodiment of the present invention.

Then, as shown in FIG. 10A, the capacitor component 30 is embedded by forming the upper interlayer insulating layer 40 on the capacitor component 30 and the core substrate 10. At this time, when a clearance on the lower surface side of the capacitor component 30 is not completely buried, a liquid resin may be filled into a clearance around the capacitor component 30 before the upper interlayer insulating layer 40 is formed.

Figure 10B:
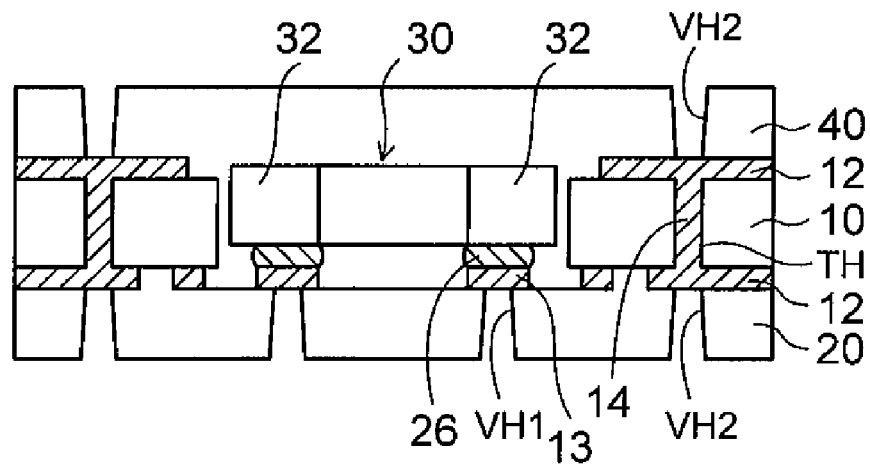

Then, as shown in FIG. 10B, the lower interlayer insulating layer 20 is laser processed. Thus, the first via holes VH1 whose depth reaches the lower surface of the connection pad 13 are formed, and also the second via holes VH2 whose depth reaches the first wiring layer 12 on the lower surface side of the core substrate 10 are formed.

Then, the upper interlayer insulating layer 40 is laser processed. Thus, the second via holes VH2 whose depth reaches the first wiring layer 12 on the upper surface side of the core substrate 10 are formed.

In the fourth embodiment, the connection terminals 32 of the capacitor component 30 are mounted on the connection pads 13. Therefore, such a structure is obtained that, upon forming the first via holes VH1, the connection terminals 32 of the capacitor component 30 are not exposed to the laser beam. As a result, even though the capacitor component 30 that is weak against the damage is employed, the capacitor component 30 can be built in the core substrate 10 with good reliability.

Figure 10C:
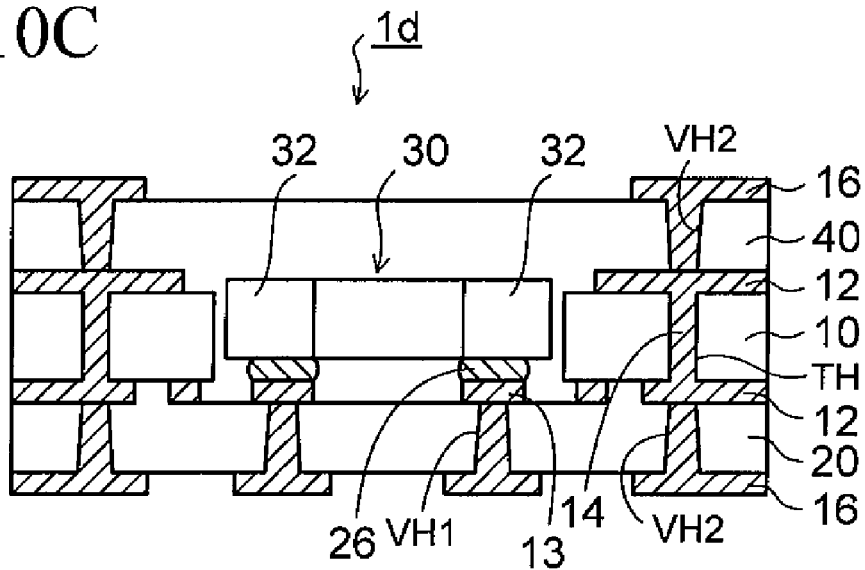

Then, as shown in FIG. 10C, the second wiring layer 16 that is connected to the connection pads 13 via the first via holes VH1 and also connected to the first wiring layer 12 on the lower surface side of the core substrate 10 via the second via holes VH2 is formed on the lower interlayer insulating layer 20. Also, the second wiring layer 16 that is connected to the first wiring layer 12 on the upper surface side of the core substrate 10 via the second via holes VH2 is formed on the upper interlayer insulating layer 40. The second wiring layer 16 on the lower surface side of the core substrate 10 is connected electrically to the connection terminals 32 of the capacitor component 30 via the connection pads 13 and the solder 26.

In this case, as occasion demands, via holes may be formed in the upper interlayer insulating layer 40 on the connection terminals 32 on the upper surface side of the capacitor component 30, and the second wiring layer 16 may be connected to the connection terminals 32 on the upper surface side of the capacitor component 30.

Accordingly, an electronic component built-in substrate 1d of the fourth embodiment is obtained. Also, like the first embodiment, this substrate can be applied to the semiconductor device, or the like.

The fourth embodiment can achieve the similar advantages to those in the first embodiment. In addition, the electronic component can be built in the substrate with better reliability than that in the first to third embodiments.

Fifth Embodiment

FIGS. 11A to 11D are sectional views showing a method of manufacturing an electronic component built-in substrate according to a fifth embodiment of the present invention.

In the fifth embodiment, a semiconductor chip is mounted instead of the capacitor component in the forth embodiment. In the fifth embodiment, detailed explanation about the same steps as those in the first embodiment will be omitted herein.

Figure 11A:
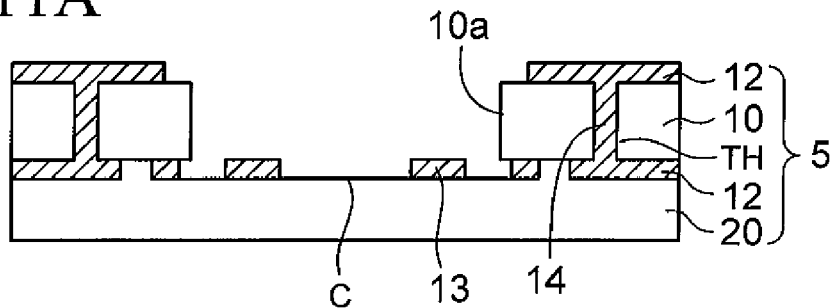
FIGS. 11A to 11D are sectional views showing a method of manufacturing an electronic component built-in substrate according to a fifth embodiment of the present invention.

In the method of manufacturing the electronic component built-in substrate of the fifth embodiment, as shown in FIG. 11A, the connection pads 13 are formed by patterning the stopper metal layer 12a of the bottom portion of the concave portion C of the mounted body 5, like FIG. 9C in the fourth embodiment.

Figure 11B:
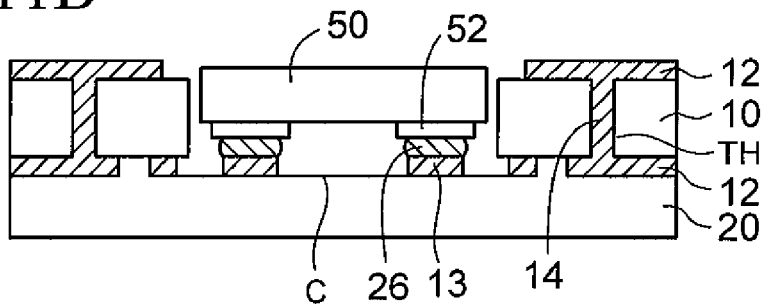

Then, as shown in FIG. 11B, the semiconductor chip 50 equipped with the connection terminals 52 (the connection pads or the connection bumps) is prepared. The connection terminals 52 of the semiconductor chip 50 are flip-chip connected to the connection pads 13 via the solder 26.

Figure 11C:
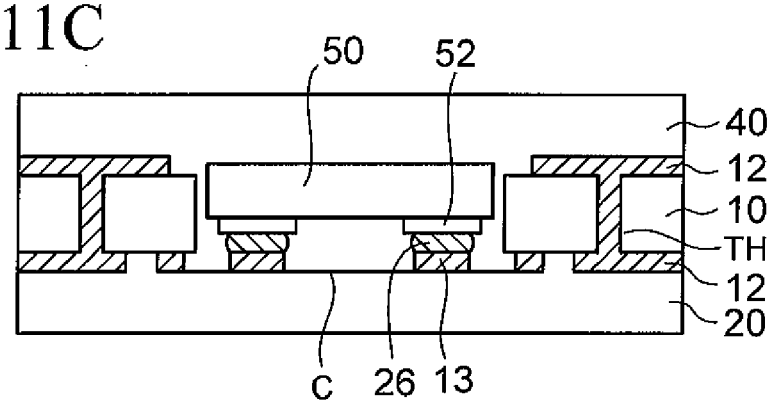

Then, as shown in FIG. 11C, the upper interlayer insulating layer 40 is formed on the semiconductor chip 50 and the core substrate 10. At this time, when a clearance on the lower side of the semiconductor chip 50 is not completely buried, a liquid resin may be filled into a clearance around the semiconductor chip 50 before the upper interlayer insulating layer 40 is formed.

Figure 11D:
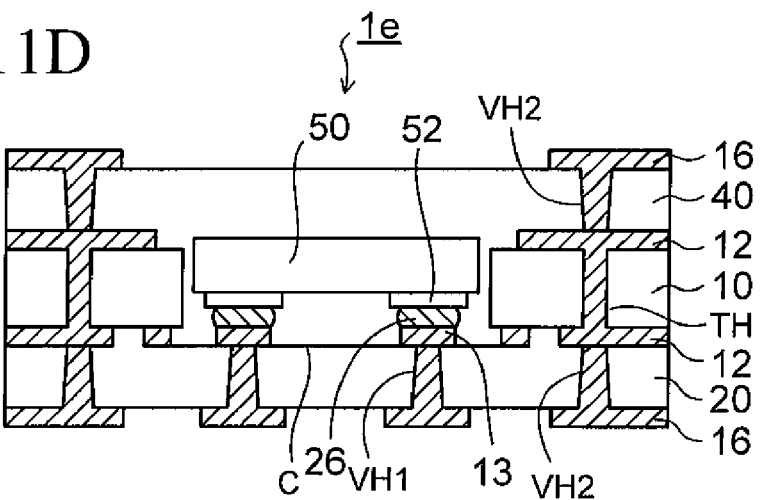

Then, as shown in FIG. 11D, like the fourth embodiment, the second wiring layer 16 connected to the connection pads 13 via the first via holes VH1 and connected to the first wiring layer 12 on the lower surface side of the core substrate 10 via the second via holes VH2 is formed on the lower interlayer insulating layer 20. Also, the second wiring layer 16 connected to the first wiring layer 12 on the upper surface side of the core substrate 10 via the second via holes VH2 is formed on the upper interlayer insulating layer 40.

The second wiring layer 16 on the lower surface side of the core substrate 10 is connected electrically to the connection terminals 52 of the semiconductor chip 50 via the connection pads 13 and the solder 26.

Accordingly, an electronic component built-in substrate 1e of the fifth embodiment is obtained. Also, like the first embodiment, this substrate can be applied to the semiconductor device, or the like.

The fifth embodiment can achieve the similar advantages to those of the first embodiment. In addition to this, in the fifth embodiment, such a structure is obtained that, upon forming the first via holes VH1, the connection terminals 52 of the semiconductor chip 50 are not exposed to the laser beam, like the fourth embodiment. As a result, even though the semiconductor chip 50 that is weak against the damage is employed, the semiconductor chip 50 can be built in the core substrate 10 with good reliability.

Sixth Embodiment

FIGS. 12A to 12C and FIGS. 13A and 13B are sectional views showing a method of manufacturing an electronic component built-in substrate according to a sixth embodiment of the present invention. A feature of the sixth embodiment resides in that the electronic component is mounted in a state that the whole of the stopper metal layer still remains on the bottom portion of the concave portion of the mounted body. In the sixth embodiment, detailed explanation about the same steps as those in the first embodiment will be omitted herein.

Figure 12A:
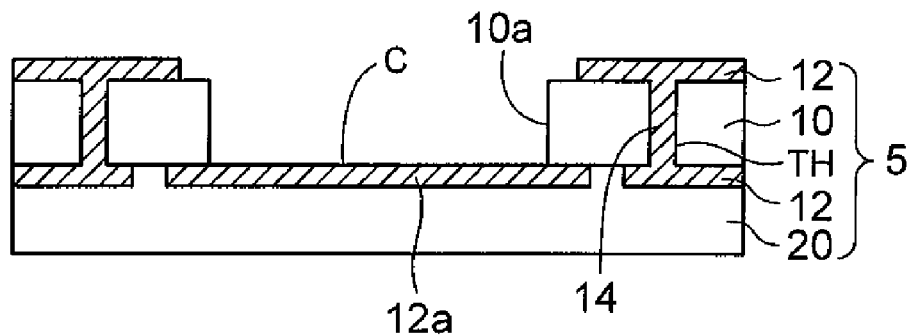
FIGS. 12A to 12C are sectional views (#1) showing a method of manufacturing an electronic component built-in substrate according to a sixth embodiment of the present invention.

In the method of manufacturing the electronic component built-in substrate of the sixth embodiment, as shown in FIG. 12A, the step of removing the stopper metal layer 12a in FIG. 3C in the first embodiment is omitted, and the stopper metal layer 12a is still left on the bottom portion of the concave portion C of the mounted body 5.

Figure 12B:
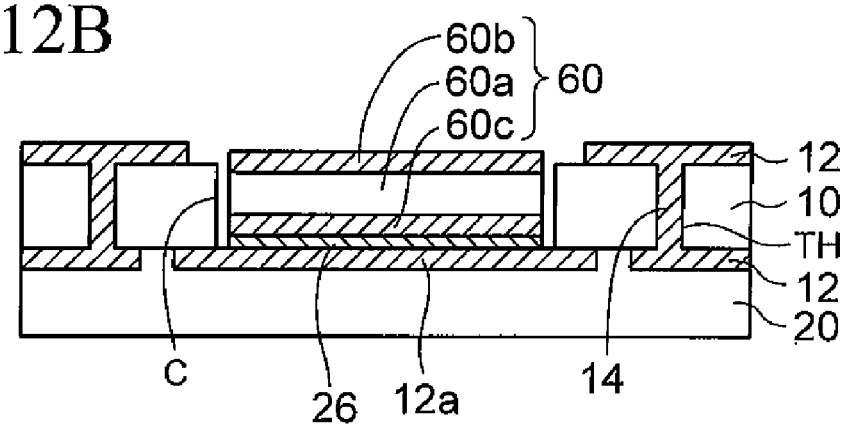

Then, as shown in FIG. 12B, a parallel-plate type capacitor component 60 having such a structure that a dielectric layer 60a is sandwiched between an upper electrode 60b and a lower electrode 60c (connection terminal) is prepared. The lower electrode 60c of the capacitor component 60 is joined to the stopper metal layer 12a in the concave portion C of the mounted body 5 with the solder 26. The stopper metal layer 12a may be used as the pads that are connected electrically to the first wiring layer 12 on the lower surface side of the core substrate 10 or may be separated from the first wiring layer 12.

Figure 12C:
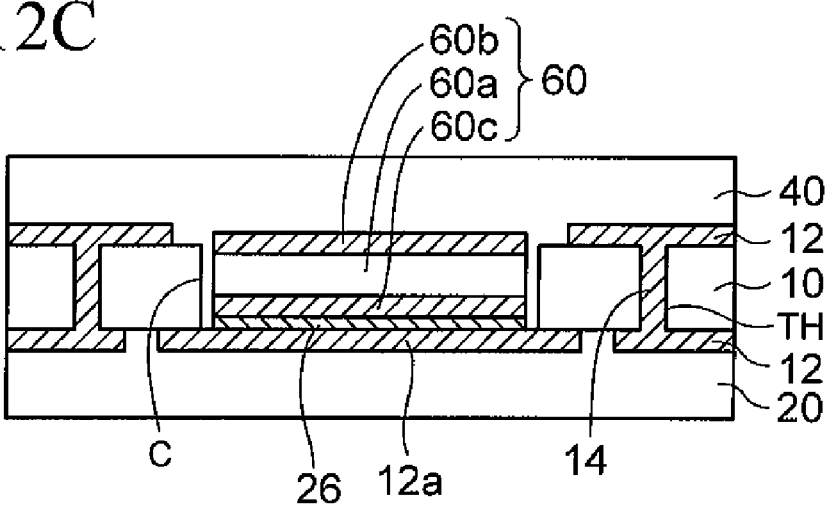
Figure 13A:
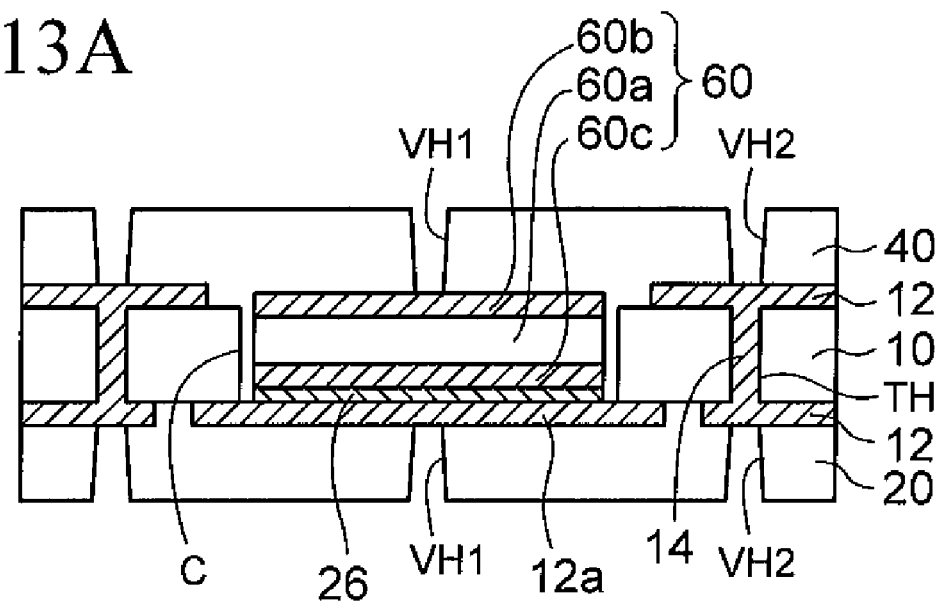
FIGS. 13A and 13B are sectional views (#2) showing a method of manufacturing the electronic component built-in substrate according to the sixth embodiment of the present invention.

Then, as shown in FIG. 12C, the upper interlayer insulating layer 40 is formed on the capacitor component 60 and the core substrate 10. Then, as shown in FIG. 13A, the first via holes VH1 whose depth reaches the upper electrode 60b of the capacitor component 60 and the second via holes VH2 whose depth reaches the first wiring layer 12 on the upper surface side of the core substrate 10 are formed in the upper interlayer insulating layer 40. Similarly, the first via holes VH1 whose depth reaches the stopper metal layer 12a and the second via holes VH2 whose depth reaches the first wiring layer 12 on the lower surface side of the core substrate 10 are formed in the lower interlayer insulating layer 20.

Figure 13B:
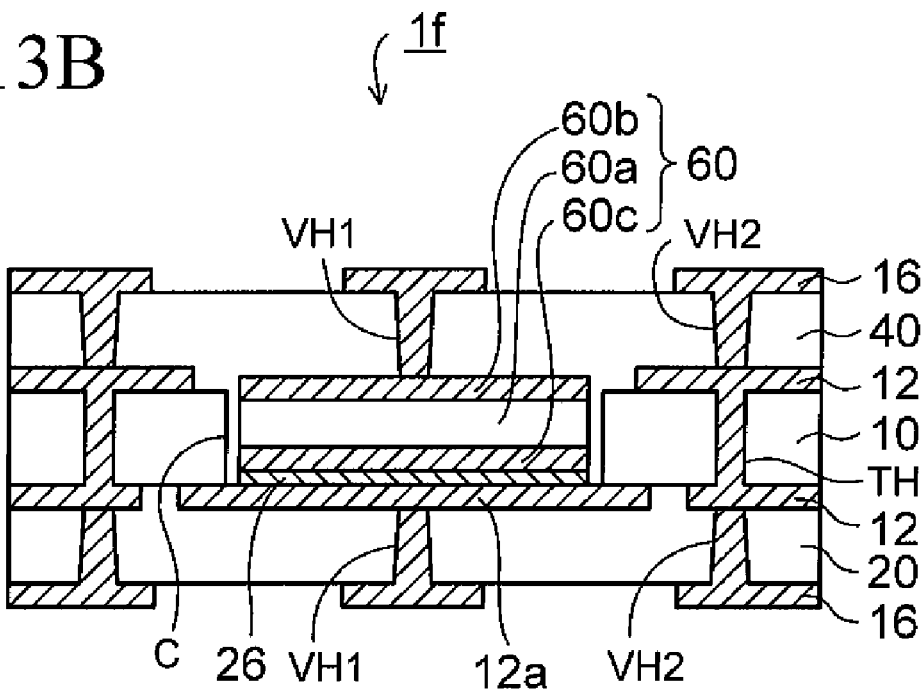

Then, as shown in FIG. 13B, the second wiring layer 16 connected to the upper electrode 60b of the capacitor component 60 via the first via holes VH1 and connected to the first wiring layer 12 on the upper surface side of the core substrate 10 via the second via holes VH2 is formed on the upper interlayer insulating layer 40.

Then, the second wiring layer 16 connected to the stopper metal layer 12a via the first via holes VH1 and connected to the first wiring layer 12 on the lower surface side of the core substrate 10 via the second via holes VH2 is formed on the lower interlayer insulating layer 20. The second wiring layer 16 on the lower surface side of the core substrate 10 is connected electrically to the lower electrode 60c of the capacitor component 60 via the stopper metal layer 12a and the solder 26.

Accordingly, an electronic component built-in substrate 1f of the sixth embodiment is obtained. Also, like the first embodiment, this substrate can be applied to the semiconductor device, or the like.

In the sixth embodiment, the parallel-plate type capacitor component 60 is illustrated as the electronic component, but either a resistor or an inductor having the similar electrode structure can be mounted. Otherwise, the back surface side of the semiconductor chip may be adhered onto the stopper metal layer 12a with the adhesive while directing their connection terminals upward.

The sixth embodiment can achieve the similar advantages to those in the first embodiment. In the sixth embodiment, there is no need to remove the stopper metal layer 12a or shape it into a pattern. Therefore, manufacturing steps can be simplified rather than the first to fifth embodiments.

Here, like the first embodiment, the parallel-plate type capacitor component 60 may be mounted in a state that the stopper metal layer 12a is removed completely. In this case, the first via holes VH1 on the lower surface side of the core substrate 10 are formed to reach the lower electrode 60c of the capacitor component 60.

What is claimed is:

1. A method of manufacturing an electronic component built-in substrate including a structure in which an electronic component is mounted in a concave portion provided in a mounted body, comprising the steps of:

preparing the mounted body including a first insulating layer and a stopper metal layer formed under the first insulating layer of a portion corresponding to a component mounting region and a second insulating layer formed under the stopper metal layer;

obtaining the concave portion by penetration-processing the portion of the first insulating layer which corresponds to the component mounting region to form an opening portion, while using the stopper metal layer as a stopper, wherein the stopper metal layer is exposed such that the stopper metal layer covers a whole of a bottom part of the opening portion;

mounting the electronic component on the stopper metal layer at a bottom portion of the concave portion in a state that a whole of the stopper metal layer is maintained, wherein the electronic component is a parallel-plate type passive component on an upper surface side and a lower surface side of which a connection terminal is provided respectively, and the connection terminal of the upper surface side is directed upward, the connection terminal of the lower surface side is electrically connected to the stopper metal layer, and the whole of the stopper metal layer is used as an electrode;

forming a third insulating layer on the electronic component and the first insulating layer;

forming a first via hole whose depth reaches the connection terminal on an upper side of the parallel-plate type passive component in the third insulating layer and, after the step of mounting the electronic component, forming a first via hole whose depth reaches the stopper metal layer in the second insulating layer; and forming a second wiring layer which is connected to the connection terminal on the upper side of the parallel-plate type passive component via the first via hole on the third insulating layer and, after the step of mounting the electronic component, forming a second wiring layer which is connected to the stopper metal layer via the first via hole on a lower surface of the second insulating layer.

2. A method of manufacturing an electronic component built-in substrate according to claim 1, wherein a second insulating layer is further formed under the stopper metal layer, and after the step of obtaining the concave portion, further comprising the steps of: exposing the second insulating layer by removing the stopper metal layer of a bottom portion of the concave portion; and mounting the electronic component on the second insulating layer of the bottom portion of the concave portion.

3. A method of manufacturing an electronic component built-in substrate according to claim 1, wherein a second insulating layer is further formed under the stopper metal layer, and after the step of obtaining the concave portion, further comprising the steps of:

forming a connection pad by patterning the stopper metal layer of a bottom portion of the concave portion; and connecting a connection terminal of the electronic component to the connection pad of the bottom portion of the concave portion to mount the electronic component.

4. A method of manufacturing an electronic component built-in substrate according to claim 2, wherein the electronic component is equipped with a connection terminal on at least of an upper surface side and a lower surface side, and after the step of mounting the electronic component, further comprising the steps of:

forming a third insulating layer on the electronic component and the first insulating layer;

forming a first via hole whose depth reaches the connection terminal of the electronic component, in at least one of the second insulating layer and the third insulating layer; and forming a second wiring layer which is connected to the connection terminal of the electronic component via the first via hole, on at least one of the second insulating layer and the third insulating layer.

5. A method of manufacturing an electronic component built-in substrate according to claim 3, after the step of mounting the electronic component, further comprising the steps of:

forming a third insulating layer on the electronic component and the first insulating layer;

forming a first via hole whose depth reaches the connection pad of the mounted body, in the second insulating layer; and forming a second wiring layer which is connected to the connection pad via the first via hole, on the second insulating layer.

6. A method of manufacturing an electronic component built-in substrate according to claim 4, wherein the first insulating layer is a core substrate on both surface sides of which a first wiring layer connected mutually via a through electrode is provided respectively, and the stopper metal layer is formed of an identical layer with the first wiring layer on the lower surface side of the core substrate.

7. A method of manufacturing an electronic component built-in substrate according to claim 6, wherein, in the step of forming the first via hole, a second via hole whose depth reaches the first wiring layer on both surface sides of the first insulating layer is formed in the second insulating layer and the third insulating layer respectively, and the second wiring layer is connected to the first wiring layer via the second via hole.

8. A method of manufacturing an electronic component built-in substrate according to claim 1, wherein, in the step of obtaining the concave portion by penetration-processing the first insulating layer, the first insulating layer is processed by laser or etching.

* * * * *